(12) United States Patent
Pino et al.

(10) Patent No.: US 8,427,203 B2
(45) Date of Patent: Apr. 23, 2013

(54) RECONFIGURABLE MEMRISTOR-BASED COMPUTING LOGIC

(75) Inventors: Robinson E. Pino, Rome, NY (US); Youngok K. Pino, Rome, NY (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 13/385,466

(22) Filed: Jan. 30, 2012

(65) Prior Publication Data

US 2012/0217995 A1    Aug. 30, 2012

Related U.S. Application Data

(60) Provisional application No. 61/463,957, filed on Feb. 25, 2011.

(51) Int. Cl.
*H03K 19/173* (2006.01)

(52) U.S. Cl.
USPC .......... 326/38; 326/39; 326/41; 326/101; 365/100; 365/148; 365/158

(58) Field of Classification Search .......... 326/37–41, 326/47, 101; 365/189.11, 154, 189.01, 230.03, 365/236
See application file for complete search history.

(56) References Cited

U.S. PATENT DOCUMENTS

| | | | |
|---|---|---|---|
| 2006/0050546 A1* | 3/2006 | Roehr | 365/148 |
| 2006/0262610 A1* | 11/2006 | Khellah et al. | 365/189.09 |
| 2008/0237797 A1* | 10/2008 | Iben et al. | 257/536 |
| 2009/0284310 A1* | 11/2009 | Koyama et al. | 327/564 |
| 2010/0182821 A1* | 7/2010 | Muraoka et al. | 365/148 |

* cited by examiner

*Primary Examiner* — Shawki Ismail
*Assistant Examiner* — Christopher Lo
(74) *Attorney, Agent, or Firm* — Joseph A. Mancini

(57) ABSTRACT

An apparatus for reconfigurable computing logic implemented by an innovative memristor based computing architecture. The invention employs a decoder to select memristor devices whose ON/OFF impedance state will determine the reconfigurable logic output. Thus, the resulting circuit design can be electronically configured and re-configured to implement any multi-input/output Boolean logic computing functionality. Moreover, the invention retains its configured logic state without the application of a current or voltage source.

6 Claims, 10 Drawing Sheets

| Input Value | Decoder Output Selection | Memristor State Configuration | | Output Value |
| --- | --- | --- | --- | --- |
| | | M1 | M2 | |
| 0 | A1 | OFF | OFF | 0 |
| 0 | A1 | OFF | ON | 0 |
| 0 | A1 | ON | OFF | 1 |
| 0 | A1 | ON | ON | 1 |
| 1 | A2 | OFF | OFF | 0 |
| 1 | A2 | ON | OFF | 0 |
| 1 | A2 | OFF | ON | 1 |
| 1 | A2 | ON | ON | 1 |

*Figure 7*

| Input Value | Decoder Output Selection | Memristor State Configuration | | Output Value | Logic Function |
| --- | --- | --- | --- | --- | --- |
| | | M1 | M2 | | |
| 0 | A1 | ON | OFF/ON | 1 | INV |
| 1 | A2 | OFF/ON | OFF | 0 | |

Figure 8

| Input Value | | Decoder Output Selection | Memristor State Configuration | Output Value | Logic Function |
|---|---|---|---|---|---|
| 0 | 0 | A1 | M1=OFF | 0 | AND |
| 0 | 1 | A2 | M2=OFF | 0 | |
| 1 | 0 | A3 | M3=OFF | 0 | |
| 1 | 1 | A4 | M4=ON | 1 | |

*Figure 9*

| Input Value | | Decoder Output Selection | Memristor State Configuration | Output Value | Logic Function |
|---|---|---|---|---|---|
| In1 | In2 | | | | |
| 0 | 0 | A1 | M1=OFF | 0 | XOR |
| 0 | 1 | A2 | M2=ON | 1 | |
| 1 | 0 | A3 | M3=ON | 1 | |
| 1 | 1 | A4 | M4=OFF | 0 | |

Figure 10

RECONFIGURABLE MEMRISTOR-BASED COMPUTING LOGIC

PRIORITY CLAIM UNDER 35 U.S.C. §119(e)

This patent application claims the priority benefit of the filing date of a provisional application Ser. No. 61/463,957, filed in the United States Patent and Trademark Office on Feb. 25, 2011.

STATEMENT OF GOVERNMENT INTEREST

The invention described herein may be manufactured and used by or for the Government for governmental purposes without the payment of any royalty thereon.

BACKGROUND OF THE INVENTION

This invention relates generally to the field of electronic circuit design. More specifically, this invention relates to electronic circuits which have a reprogrammable function. More specifically still, the present invention relates to reprogrammable electronic circuits which can function as reconfigurable logic circuits.

Reconfigurable computing logic describes the ability to transform the functionally of a Boolean function from let us say a logic AND gate to a logic OR gate functionality without physical rewiring and vice versa. Today, this type of logic reconfiguration is not possible as the operational functionality of transistors, resistors, capacitors, and inductors is fixed and electronically unchangeable. However, there exists a new electronic device whose impedance state is electronically variable and non-volatile. The name of such device is the memristor. The electronic operational and behavioral characteristics of memristor devices have been reported recently in the literature by the authors [2]. Pino and Bohl have described mathematically that memristors can operate within a range of impedance states bounded by a maximum, $R_{High}$, and minimum. $R_{Low}$, resistance values. The switching characteristics of the memristor devices between their ON and OFF states, $R_{High}$ and $R_{Low}$, are governed by discrete threshold voltages, $V_{High}$ and $V_{Low}$, that switch the device ON and OFF respectively [1]. In addition, the memristor device whose name stands for memory resistor is of particular interest because it is a passive device that when power is turned off, it remembers its previous impedance state [3][4][5].

Digital computing architectures that can reconfigure computing logic to (transform the functionality of a Boolean function) are known in the prior art. However, for these methods to be effective they would require one or more of the following: a high degree scalability, non-volatile memory, reconfiguration of the logic functions that is not reliant on software control and external memory.

In a context of circuitry and computing logic, as utilized herein, the term scalable, alone or in combination, means the capability of a circuit to handle an increased demand of work in a graceful manner.

U.S. Pat. No. 7,439,766 B2 to Schmit et al. discloses a method for a configurable logic circuit capable of performing different logic functions on the input data to produce output data. By having at least two configuration data sub-sets, configuring a logic circuit is achievable. This method has the disadvantage, however, in that it is not scalable, it relies upon software to reconfigure the logic functions and it requires external memory because the memory element in its FPGA is volatile.

U.S. Pat. No. 7,545,013 B2 to Sugahara et at discloses a method to provide a non-volatile reconfigurable logic circuit. Reconfiguration of the logic function is achieved by varying the driving force of the transistors through the control of the magnetization state of the spin transistors. Non-volatility is achieved because the magnetization states do not change when the power is cut off. The logic circuit reconfigures logic functions in terms of hardware, and therefore the use of software is not required for reconfiguration. This method has the disadvantage, however, in that it does not scale.

U.S. Pat. No. 7,796,423 B2 to Sugiyama et at discloses a method to perform complex logic functions in a reconfigurable logic circuit. Non-volatility is achieved by using spin MOSFETs (metal-oxide-semiconductor field-effect transistor) because they contain non-volatile magnetic memory. Use of an external memory is not required. This method has the disadvantage, however, in that it does not scale and it requires software to reconfigure logic functions.

U.S. Pat. No. 7,851,877 B2 to Tanaka et at discloses a method to reconfigure logic functions in a non-volatile manner by changing the magnetization direction of the single-electron spin transistor. No external memory is required. This method also has the disadvantage in that it does not scale.

Non Patent Reference to Rajendran et al. discloses a method of implementing all 2-input and 3-input Boolean functions by varying the values of the inputs for the memristor device. This method does not require external memory. This method has the disadvantage, however, in that it uses current mirror circuits which continuously consume current, rendering this method not scalable, and it requires software to choose the optimal memristance value.

Non Patent Reference to Xia et al. discloses a method of wiring logic gates using memristors in a FPGA-like circuit. By using memristors, non-volatility can be achieved. This method has the disadvantage, however, in that it does not scale; it requires software to reconfigure the logic functions and the reconfiguration of the logic function is not optimal in that the selection of a logic function is based on the path taken from the wiring of the logic gates.

What is lacking in the prior art, therefore, is computing logic circuitry that is capable of being electronically reconfigured to perform various Boolean functions in a scalable fashion and that will retain its reconfigured state in the absence of applied current or voltage.

OBJECTS AND SUMMARY OF THE INVENTION

It is an object of the present invention to provide an apparatus for computing logic that can be electrically reconfigured to perform any one of several boolean operations.

It is another object of the present invention, then, to provide an apparatus for electrically reconfigurable computing logic that employs fundamental building block structure for a high order of scalability.

It is yet another object of the present invention to provide an apparatus for electrically reconfigurable computing logic that will maintain its reconfigured state in the absence of supply power or power consumption.

Briefly stated, the present invention provides an apparatus for reconfigurable computing logic implemented by an innovative memristor based computing architecture. The invention employs a decoder to select memristor devices whose ON/OFF impedance state will determine the reconfigurable logic output. Thus, the resulting circuit design can be configured and re-configured electronically to implement any multi-input/output Boolean logic computing functionality.

Moreover, the invention retains its configured logic state without the application of a current or voltage source.

A fundamental embodiment of the present invention comprises a decoder having at least one input and at least two outputs, at least one power/reconfigure block, at least two programmable resistance blocks, and at least one logic output block. A signal applied to an input of the decoder is decoded and applied as an input to any of at least two programmable resistance blocks according to a decoding scheme. A signal output from any of the same at least two programmable resistance blocks in response to the aforesaid applied signal into any of the same at least two programmable resistance blocks is input into the at least one output block. The at least one logic output block corrects the voltage and logic state of the reconfigurable computing logic output and the at least one power/reconfigure block powers the reconfigurable computing logic so as to selectively direct a voltage and current to reprogram any of the at least two programmable resistance blocks.

The above and other objects, features and advantages of the present invention will become apparent from the following description read in conjunction with the accompanying drawings, in which like reference numerals designate the same elements.

References

[1] R. Pino, J. Bohl "Method for Modeling Memristor Devices," Pending, U.S. Pat. Ser. No. 12/657,262—AF Inv # RL 10,051, December 2009.

[2] R. Pino, J. W. Bohl, N. McDonald, B. Wysocki, P. Rozwood, K. Campbell, "Compact Method for Modeling and Simulation of Memristor Devices," *IEEE/ACM International Symposium on Nanoscale Architectures*, NANOARCH'10, Anaheim, Calif., Jun. 17-18, 2010

[3] Leon O. Chua, "Memristor—The Missing Circuit Element" *IEEE Transactions on Circuits Theory*, 18 (1971) 507-519.

[4] D. B. Strukov, G. S. Snider, D. R. Stewart, S. R. Williams, "The missing memristor found," *Nature*, 453 (2008) 80-83.

[5] R. Stanley Williams, "How We Found the Missing Memristor," IEEE Spectrum (2008) 29-35.

[6] A. P. Godse and D. A. Godse, "Digital Logic Design," *Technical Publications Pune*, Pune, India (2008).

BRIEF DESCRIPTION OF THE DRAWINGS

FIG. 7 depicts all the possible combinations in which the various ON/OFF memristor values combinations will reconfigure the logic output.

FIG. 8 depicts the circuit logic configuration for the design in FIG. 1 to exhibit the logic properties of the inverter circuit.

FIG. 9 depicts a memristor configuration set to enable the two-input one-output logic circuit to exhibit the characteristic properties of an AND computing logic functionality.

FIG. 10 depicts memristor configuration set to enable the two-input one-output logic circuit to exhibit the characteristic properties of an XOR computing logic functionality.

DETAILED DESCRIPTION OF THE PREFERRED EMBODIMENT

The present invention provides an apparatus and method for implementing a reconfigurable computing logic circuit based upon the reprogrammable properties of memristors.

Figure 1:
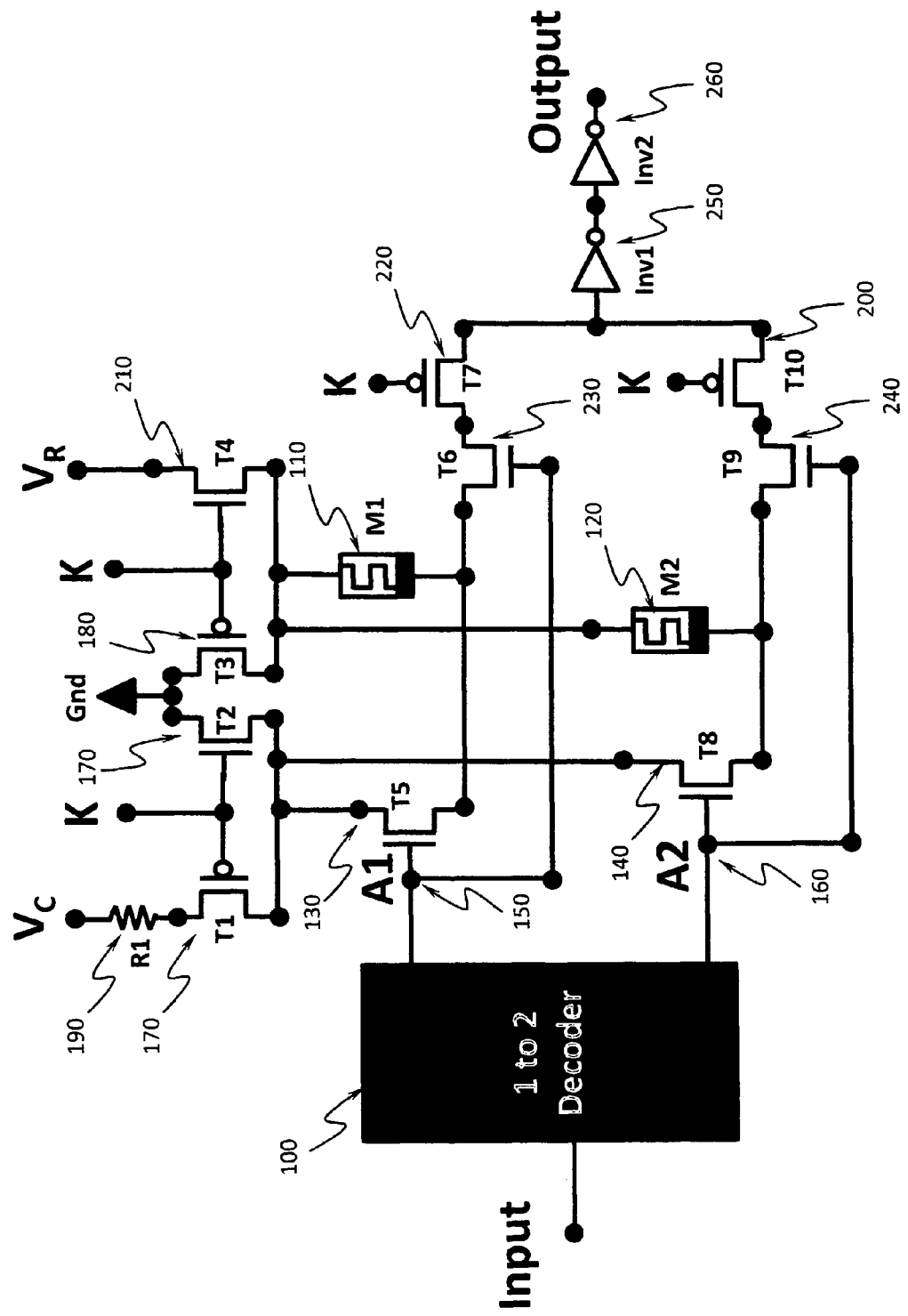
FIG. 1 depicts the design architecture of a basic single binary input reconfigurable inverting/non-inverting logic gate.

The present invention comprises of several key features. Referring to FIG. 1 depicts a basic embodiment of the present invention. A digital binary decoder 100 is used to take multiple inputs and select a single output out of multiple combinations. A binary decoder which has an n-bit binary input code and a one activated output out-of-$2^n$ output code is called a binary decoder, and it is used when it is necessary to activate exactly one of its $2^n$ outputs based on an n-bit input value [6]. The remaining elements of the present invention's computing architecture design components generally comprise n- and p-channel field effect transistors, resistors, and inverting logic gates in various quantities and configurations.

Still referring to FIG. 1, describes one basic embodiment of the present invention comprising a single binary input reconfigurable inverting/non-inverting logic gate. The function of node $V_C$ is to deliver a power to the circuit. Node $V_R$ delivers the threshold voltages required to switch the memristors M1 110 and M2 120 ON/OFF. Node K is the select I/O to operate/configure the reconfigurable logic gate respectively. From FIG. 1 it is apparent that when for example the decoder input is 0, the decoder will select the output line A1 150. This means that the output of the decoder will be A1=1 and A2=0. In this instance, the gate of n-channel transistor T5 130 will be selected turning the transistor to the ON state. Similarly, n-channel transistor T8 140 will remain in the OFF state as the output of to A2 160 is currently 0. Assuming the signal at node K=0, for operation of the logic gate, the p-channel transistors T1 170 and T3 180 will be on their ON state while the n-channel transistors will be in the OFF state. Thus, when K=0, $V_C$ will be connected to the drain terminal of transistors T5 130 and T8 140. Also, the memristors M1 110 and M2 120 will be connected to ground through the p-channel transistor T3 180. This biasing scheme will allow the $V_C$ node to be connected in series with resistor R1 190 and in parallel with transistors T5 130 and T8 140 in turn whose source terminals are connected to memristors M1 110 and M2 120 respectively.

Still referring to FIG. 1 and assuming that we can neglect the channel resistance for all transistors T1 170 through T10 200, the voltage across memristors M1 110 and M2 120, respectively, is given by the following two equations:

$$V(M1) = M1\frac{V_C}{R1+M1} \text{ if } A1=1 \text{ else } V(M1)=0 \quad (1)$$

$$V(M2) = M2\frac{V_C}{R1+M2} \text{ if } A2=1 \text{ else } V(M1)=0 \quad (2)$$

From the electronic properties of memristor devices [2], it can be correctly assumed that memristor impedance variations can range from $R_{Low}=100\,\Omega$ up to $R_{High}=2,000\,\Omega$. For an R1 190 resistance value of 250 $\Omega$, the voltage across the memristor can vary from $V(M=R_{Low})=0.29$ V up to V(M=$R_{low}$)=0.89 V. Then since A1=1 and K=0, both the n- and p-channel transistors T6 230 and T7 220 will be on the ON state respectively. This will allow the voltage at the input of the inverting circuit Inv1 to range between 0.29 and 0.89 V. The function of the inverter circuit as the name suggests is to invert the value input to it. For example, if the input to the inverter is 0 the output will be 1 and vice versa. In addition, an ideal inverter circuit can be described by a sigmoid threshold function in which the threshold for determining the output of the circuit corresponds to half the operating voltage. Thus, for the inverter circuit to output 1 V, the input voltage needs to be below 0.5 V. If the operating voltage is 1 V, and if the output of the inverter is to be 0 V, the input to the inverter circuit needs to be above 0.5 V. However, the voltage range across the memristor is from 0.29 to 0.89 V. Therefore, when the voltage across the memristor is 0.29 V, the output of inverter Inv1 250 will be 1 V, and when the input is 0.89 V. the output of inverter Inv1 250 will be 0 V. Given that the output of the first inverter Inv1 250 will output the complement of computing logic function, a second inverter Inv2 260 is used to correct the logic output. In summary, FIG. 7 shows all the possible combinations in which the various ON/OFF memristor values combinations will reconfigure the logic output of the single binary input reconfigurable inverting/non-inverting logic gate depicted in FIG. 1. If we look closely at the logic circuit in FIG. 1 and the results in FIG. 7, it is evident that there is one memristor for each decoder output, and the output is directly proportional to the state of the memristor connected to it. Thus the overall output of the logic circuit depends on a single memristor device that is chosen through the decoder, and the state of any other memristor can be ignored as shown in FIG. 7. In FIG. 1, the n-channel transistors T7 220 and T10 200 are used to decouple the unselected memristor as the voltage of each unselected decoder output is 0 V. FIG. 8 shows the circuit logic configuration for the logic circuit design in FIG. 1 necessary to exhibit the logic properties of the inverter circuit.

Finally, configuration (i.e., programming the resistance) of memristors M1 110 and M2 120 to achieve logic reconfiguration of the overall logic circuit can be performed with memristors M1 110 and M2 120 "in circuit". Specifically, when the node K is set to 1 V in the logic circuit schematic design shown in FIG. 1 it will cause the n-channel transistor T4 210 to turn ON and the p-channel transistors T1 170, T3 180, T7 220, and T10 200 to turn OFF. Thus, a direct path from node $V_R$ to ground is now established and node $V_C$ is isolated. Now that the memristor is connected directly to ground, node $V_R$ can be used to apply the specific voltage value to switch the memristor device from ON to OFF state and vice versa. Also, only one memristor can be reconfigured at a time, and the memristor that can be reconfigured corresponds to the selected by the output of the decoder.

Selecting decoder output A1 150 turns on T5 130 and with K=1 volt turns on T2 170 and T4 210, thereby allowing current from Vr to flow through T4 210, M1 110, T5 130, and T2 170 to ground so as to program M1 110 but not M2 120. Similarly, selecting decoder output A2 160 turns on T8 140 and with K=1 volt turns on T2 170 and T4 210, thereby allowing current from Vr to flow through T4 210, M2 120, T8 140, and T2 170 to ground so as to program M2 120 but not M1 110. Thus, any particular logic function can be configured one memristor at a time.

Figure 2:
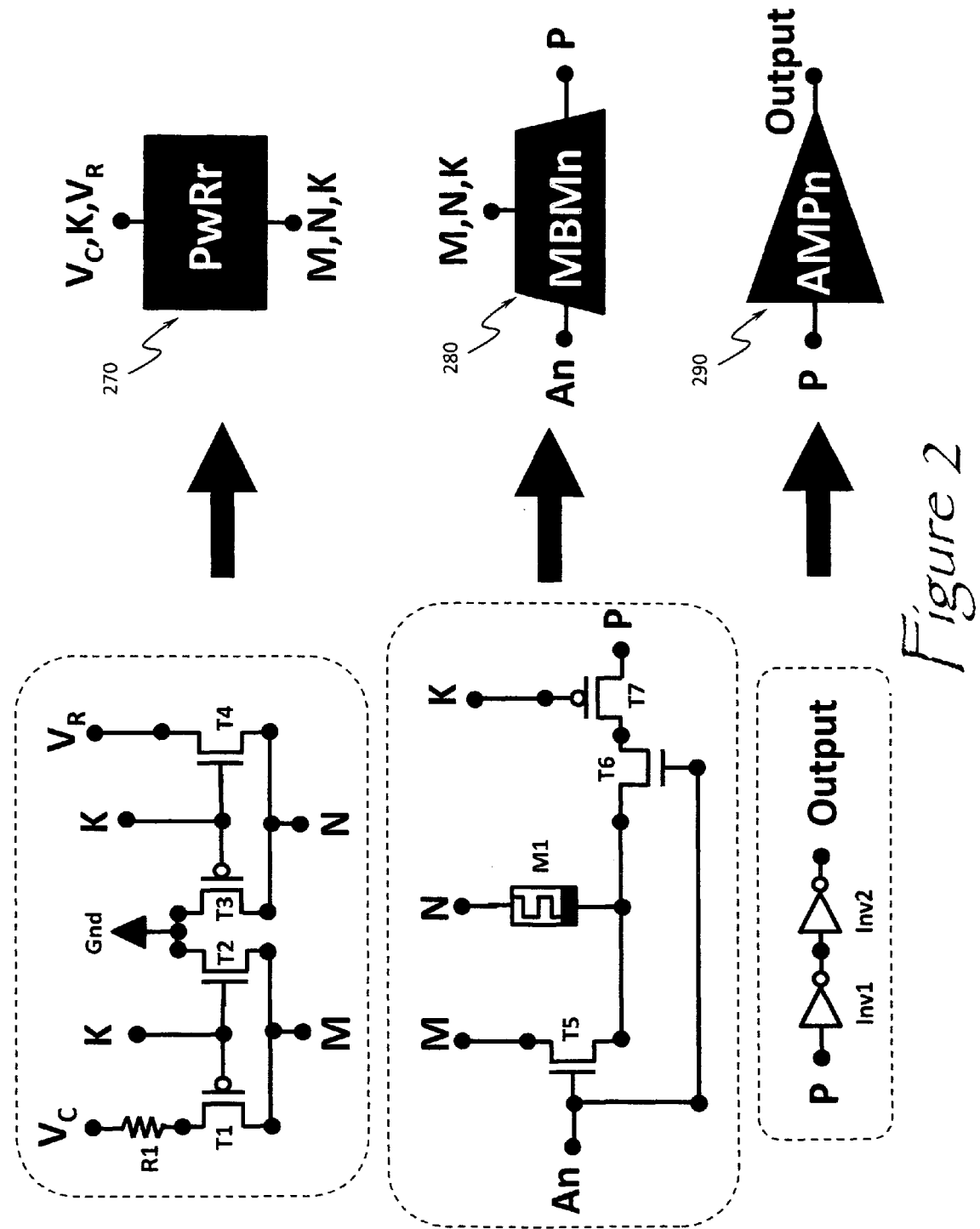
FIG. 2 depicts how defined cell blocks can be used to simplify the circuit schematic.

Referring to FIG. 2, the present invention is capable of being scaled-up in complexity from the basic logic function performed in FIG. 1. In scaling the reconfigurable logic computing architecture of this invention, defined cell blocks can be used to simplify the circuit schematic. Still referring to FIG. 2, the cell block diagram PwRr 270 is used to power and reconfigure the logic, MBMn 280 represents the nth memristor element, and AMPn 290 the nth output of the reconfigurable logic circuit.

Figure 3:
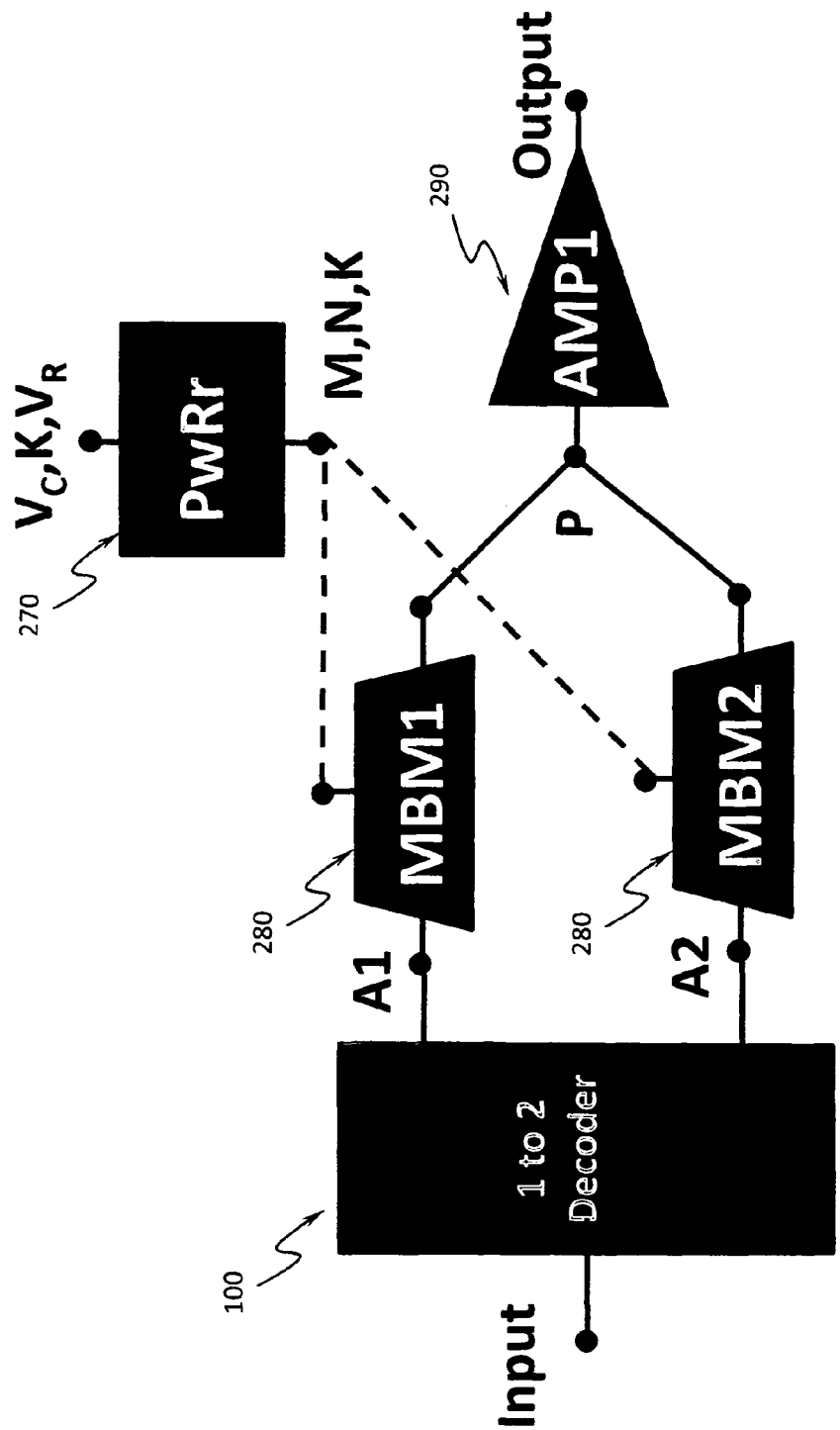
FIG. 3 depicts the simplified block cell single binary input reconfigurable circuit logic design.

Referring to FIG. 3 depicts a simplified block cell single binary input reconfigurable circuit logic design using the defined cell blocks of FIG. 2 as applied to the circuit of FIG. 1.

Figure 4:
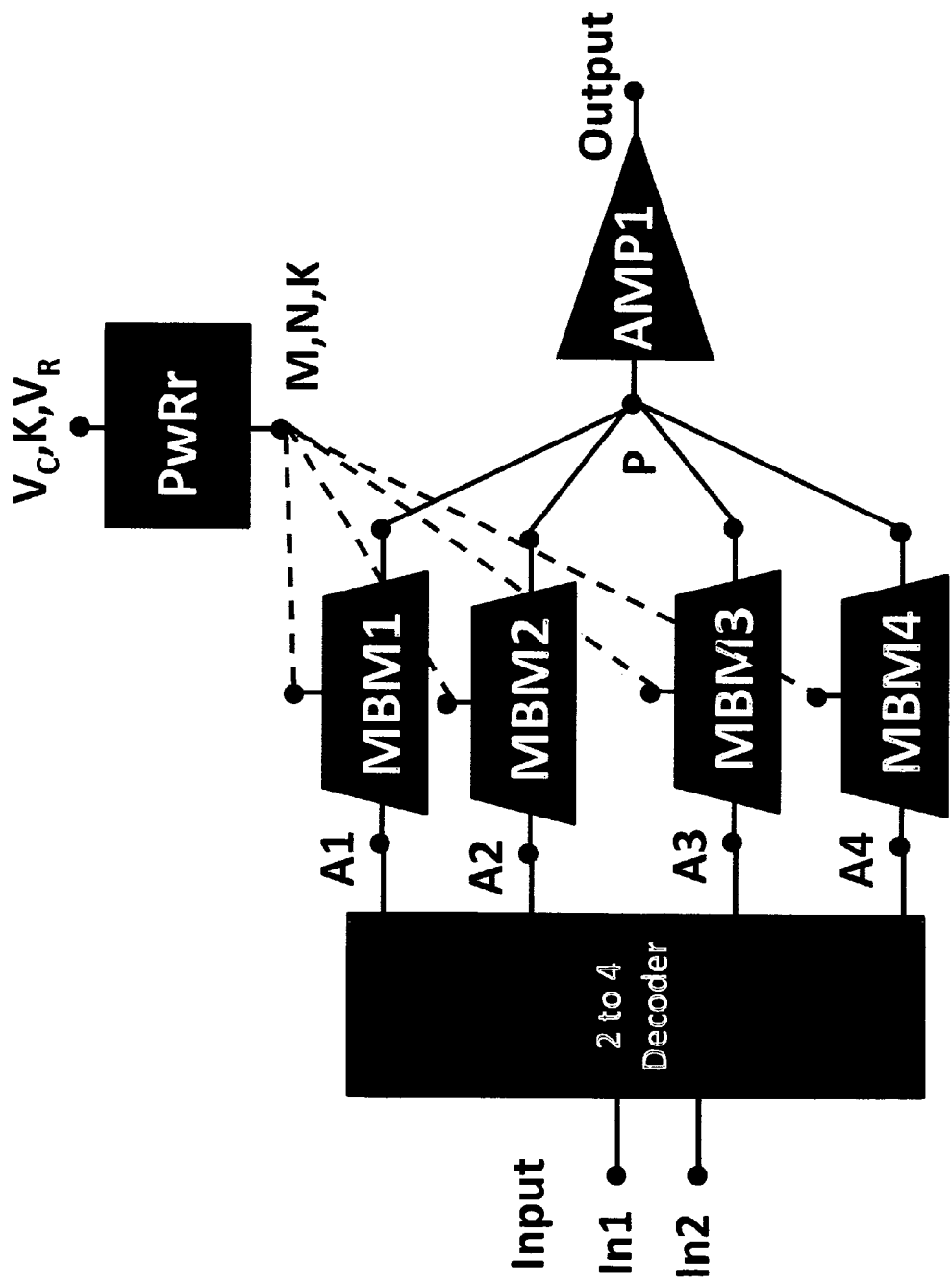
FIG. 4 depicts a two-input one-output reconfigurable computing logic function design.

Referring to FIG. 4 depicts further scaling of the present invention using the defined cell blocks of FIG. 2 combined with a multi-input decoder 300 to enable a two-input, one-output computing logic function. FIG. 9 and FIG. 10 depict how a memristor configuration can be set to enable the two-input one-output logic circuit to exhibit the characteristic properties of an AND and XOR computing logic functionalities, respectively.

Figure 5:
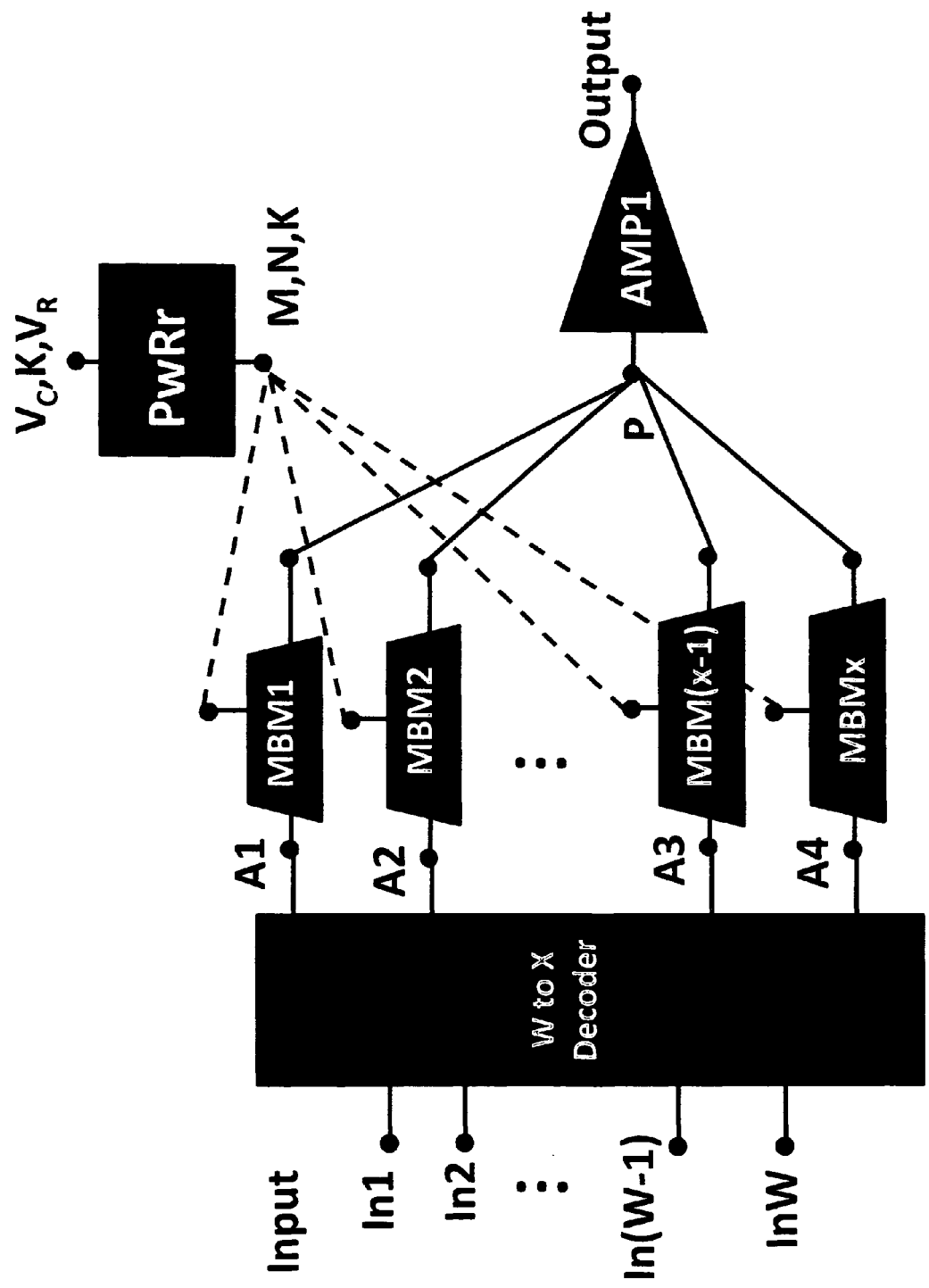
FIG. 5 depicts how multi-input multi-output reconfigurable logic functions can be designed by increasing the decodes input/output capacity, adding MBM memristor cell blocks, PwRr, and AMP cell block circuitry.
Figure 6:
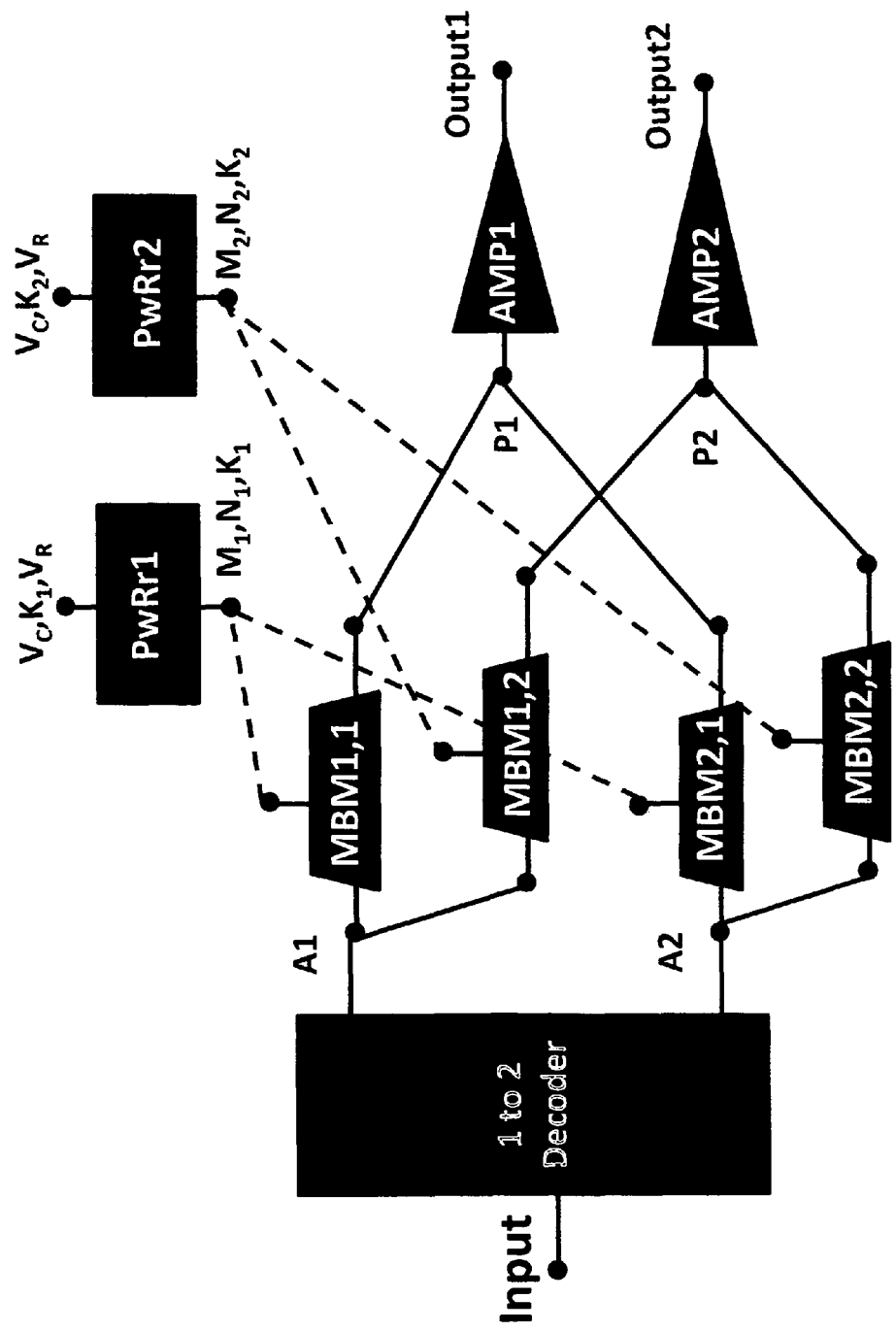
FIG. 6 depicts how a multi-output logic function can be designed by adding an additional PwRr and AMP cell block circuitry for each additional desired output.

Refering to FIG. 5 and FIG. 6 depict how multi-input multi-output reconfigurable logic functions can be designed by increasing the decoder's input/output capacity, adding MBM memristor cell blocks 280, PwRr 270, and AMP 290 cell block circuitry. In particular, FIG. 6 shows how a multi-output logic function can be designed by adding an additional PwRr 270 and AMP 290 cell block circuitry for each additional desired output.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Reconfigurable computing logic, comprising:
   a decoder having at least one input and at least two outputs;
   at least one power/reconfigure block;
      wherein said power/reconfigure block comprises:
         a power node being connected to a first terminal of a first resistance; a second terminal of said first resistance being connected to the drain of a first p-channel field effect transistor; a gate of said first p-channel field effect transistor being connected to a gate of a first n-channel field effect transistor and a signal node; a drain of said first n-channel field effect transistor being connected to ground; a source of said first n-channel field effect transistor being connected to a source of said first p-channel field effect transistor and to a first common node; a second p-channel field effect transistor having a drain connected to ground, a gate connected to said signal node, and a source connected to a second common node; a second n-channel field effect transistor having a drain connected to a threshold node, a gate connected to said signal node, and a source connected to said second common node;
   at least two programmable resistance blocks; and
   at least one logic output block; wherein
   a signal applied to said at least one input of said decoder is decoded and applied as an input to any of said at least two programmable resistance blocks according to a decoding scheme;
   a signal output from any of said at least two programmable resistance blocks in response to said applied signal into any of said at least two programmable resistance blocks, is input into said at least one output block;
   said at least one logic block corrects the voltage and logic state of said reconfigurable computing logic output; and wherein
   said at least one power/reconfigure block powers said reconfigurable computing logic; and selectively directs a voltage and current to reprogram any of said at least two programmable resistance blocks.

2. The reconfigurable computing logic of claim 1, wherein either one of said programmable resistance blocks further comprises:
a third n-channel field effect transistor having a gate connected to one output of said at least two outputs of said decoder, a drain connected to said first common node; a programmable resistance having a first terminal being connected to said second common node and a second terminal being connected to said source of said third n-channel field effect transistor; a fourth n-channel field effect transistor having a drain being connected to said second terminal of said programmable resistance, a gate connected to said one output of said at least two outputs of said decoder, and a source; a third p-channel field effect transistor having a source being connected to said source of said fourth n-channel field effect transistor, a gate being connected to said signal node, and a drain being connected to a logic node.

3. The reconfigurable computing logic of claim 2, wherein said at least one logic block comprising a first inverter and a second inverter; said first inverter having an input being connected to said logic node and a output being connected to an input of said second inverter; and said second inverter having an output being connected to an output of said reconfigurable computing logic.

4. The reconfigurable computing logic of claim 2 further comprising means to program said programmable resistance, said means causing:
an output of said decoder being selected so as to turn on said third n-channel field effect transistor; and
a signal being applied to said signal node so as to turn on said first n-channel field effect transistor and said second n-channel field effect transistor so as to cause current to flow from said threshold node, through said second n-channel field effect transistor, through said second common node, through said programmable resistance, through said third n-channel field effect transistor, through said first common node, and through said first n-channel field effect transistor to ground.

5. The reconfigurable computing logic of claim 1, wherein said at least two programmable resistance blocks comprise at least one memristor each.

6. The reconfigurable computing logic of claim 1, wherein said decoder is a digital binary encoder having a n-bit input code and a $2^n$ output code.

* * * * *